(12) United States Patent
Nagahama

(10) Patent No.: US 9,468,110 B2
(45) Date of Patent: Oct. 11, 2016

(54) CHASSIS ASSEMBLY STRUCTURE

(75) Inventor: Tomoyuki Nagahama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/404,880

(22) PCT Filed: Aug. 3, 2012

(86) PCT No.: PCT/JP2012/069879
§ 371 (c)(1),
(2), (4) Date: Dec. 1, 2014

(87) PCT Pub. No.: WO2014/020761
PCT Pub. Date: Feb. 6, 2014

(65) Prior Publication Data
US 2015/0305171 A1    Oct. 22, 2015

(51) Int. Cl.
| | | |
|---|---|---|
| *A47B 81/00* | (2006.01) | |
| *A47B 97/00* | (2006.01) | |
| *H05K 5/00* | (2006.01) | |
| *H04B 1/08* | (2006.01) | |
| *B60R 11/02* | (2006.01) | |

(52) U.S. Cl.
CPC ......... *H05K 5/0013* (2013.01); *B60R 11/0205* (2013.01); *B60R 11/0258* (2013.01); *H04B 1/082* (2013.01)

(58) Field of Classification Search
CPC .... H05K 5/02; H05K 5/0013; H05K 5/0221; H05K 5/0217; B60R 11/02; G06F 1/181
See application file for complete search history.

(56) References Cited

U.S. PATENT DOCUMENTS

| | | | | |
|---|---|---|---|---|
| 2,858,179 A | * | 10/1958 | Puerner ................... | H05K 5/04 15/215 |
| 4,431,113 A | * | 2/1984 | Sims, Jr. .................. | H05K 5/03 220/3.8 |
| 4,772,079 A | * | 9/1988 | Douglas .................. | B60R 11/02 109/50 |
| 5,193,890 A | * | 3/1993 | Robertson, Jr. ......... | A47B 81/06 248/27.1 |
| 5,245,511 A | * | 9/1993 | Watanabe ............... | B60R 11/02 248/27.3 |
| 5,251,771 A | * | 10/1993 | Hotsumi ................. | B60R 11/02 220/241 |
| 5,373,104 A | * | 12/1994 | Brauer ................. | H05K 7/1417 174/562 |

(Continued)

FOREIGN PATENT DOCUMENTS

| | | |
|---|---|---|
| JP | 62-160590 U | 10/1987 |
| JP | 2-305496 A | 12/1990 |

(Continued)

*Primary Examiner* — Daniel J Troy
*Assistant Examiner* — Kimberley S Wright
(74) *Attorney, Agent, or Firm* — Birch, Stewart, Kolasch & Birch, LLP

(57) ABSTRACT

According to a chassis assembly structure, in assembling a front chassis side assembly in a bottom chassis, a front chassis side assembly 120 is configured such that when an upper surface end of a mechanical holder 103 projected to the rear side of a mechanical holder 103 is brought into contact with a rear-side bent part 111 of a bottom chassis 101, and a front side thereof is rotated about the contact portion serving as a rotational support axis toward the bottom chassis 101, a lower part of a front chassis 105 is invited and fitted between an angled pressing tab 113 and an upright part 112 along an inclined surface of an angled pressing tab 113.

2 Claims, 10 Drawing Sheets

(56) References Cited

U.S. PATENT DOCUMENTS

| | | | | |
|---|---|---|---|---|
| 5,400,215 A * | 3/1995 | Chung | ............... | B60R 11/0211 312/334.39 |
| 5,441,421 A * | 8/1995 | Ponticelli, Jr. | ...... | B60R 11/0205 439/284 |
| 7,601,911 B2 * | 10/2009 | Iwano | ................ | B60R 11/02 174/17 R |
| 8,807,618 B2 * | 8/2014 | Dou | ................ | B60R 11/02 248/221.11 |
| 8,917,519 B2 * | 12/2014 | Sano | ................ | H05K 5/0221 206/706 |
| 2001/0019477 A1 * | 9/2001 | Murasawa | ............ | H05K 9/0037 361/816 |
| 2005/0094380 A1 * | 5/2005 | Mukougawa | ........ | H05K 5/0013 361/724 |
| 2005/0219832 A1 * | 10/2005 | Pawlenko | ............ | H05K 5/0013 361/818 |
| 2005/0285486 A1 * | 12/2005 | Xu | ............ | G06F 1/181 312/223.2 |
| 2006/0053429 A1 * | 3/2006 | Hsieh | ............ | G11B 17/0285 720/648 |
| 2006/0056146 A1 * | 3/2006 | Marcade | ............ | G11B 33/12 361/679.32 |
| 2006/0126274 A1 * | 6/2006 | Iwano | ................ | B60R 11/02 361/600 |
| 2007/0001078 A1 * | 1/2007 | Martin | ............... | B60R 11/02 248/298.1 |
| 2008/0192425 A1 * | 8/2008 | Ni | ............... | H05K 5/0256 361/679.01 |
| 2009/0267465 A1 * | 10/2009 | Cheng | ............... | H05K 5/0004 312/223.2 |
| 2011/0242785 A1 * | 10/2011 | Ma | ............... | H05K 5/0217 361/807 |
| 2012/0250878 A1 * | 10/2012 | Ito | ............... | B60R 11/0205 381/86 |
| 2012/0313390 A1 * | 12/2012 | Dou | ............... | B60R 11/02 296/1.07 |
| 2013/0170160 A1 * | 7/2013 | Sano | ............... | H05K 5/0221 361/756 |
| 2014/0085780 A1 * | 3/2014 | Hsu | ............... | H05K 5/02 361/679.01 |
| 2014/0347831 A1 * | 11/2014 | Snider | ............... | H05K 9/0045 361/752 |
| 2015/0091419 A1 * | 4/2015 | Joist | ............... | G06F 1/181 312/223.1 |
| 2015/0382494 A1 * | 12/2015 | Hu | ............... | H05K 5/0221 248/314 |

FOREIGN PATENT DOCUMENTS

| | | |
|---|---|---|
| JP | 4-55180 U | 5/1992 |
| JP | 5-31281 U | 4/1993 |
| JP | 10-150286 A | 6/1998 |
| JP | 2008-186157 A | 7/2006 |

* cited by examiner

--PRIOR ART--

--PRIOR ART--

(a)

(b)

--PRIOR ART--

(a)

(b)

--PRIOR ART--

--PRIOR ART--

--PRIOR ART--

(a)

(b)

--PRIOR ART--

(a)

(b)

CHASSIS ASSEMBLY STRUCTURE

TECHNICAL FIELD

The present invention relates to a chassis assembly structure for assembling a chassis of a car audio, a navigation apparatus, or the like.

BACKGROUND ART

Generally, when a chassis of an electronic apparatus such as a car audio and a navigation apparatus is assembled, a drop lid type chassis assembly structure is employed (e.g., see Patent Documents 1 and 2, and the like).

CITATION LIST

Patent Document

Patent Document 1: Japanese Patent Application Laid-open No. 2006-186157
Patent Document 2: Japanese Patent Application Laid-open No. H10-150286

SUMMARY OF THE INVENTION

Problems to be Solved by the Invention

However, in the conventional drop lid type assembly structure, there are the following problems: when a chassis of an electronic apparatus (an assembly article of a front chassis and a mechanism) is assembled to a bottom chassis, it is assembled so as to drop vertically from right above, and therefore the size of the chassis will be regulated; and a load is applied to a terminal part (connection part of an FFC) of a reinforcing plate of an FFC (Flexible Flat Cable), and connection failure may be caused.

In addition, there are the following problems: alignment in assembling is difficult, and it is thus necessary to form a bent tab in order to prevent erroneous assembly between the chassis, and further since a hole is formed due to the formed bent tab, a matter of EMC (Electro-Magnetic Compatibility) or dust may become serious; and a tool is required in detaching between the chassis, which is inconvenient.

The present invention has been made in order to solve the foregoing problems, and an object of the invention is to provide a chassis assembly structure for an electronic apparatus such that the bent tab for preventing the erroneous assembly is eliminated, and that the load applied to the reinforcing plate of the FFC is reduced while the chassis size is reduced, and further that the assembling and detaching between the chassis can be easily performed.

Means for Solving the Problems

In order to attain the above object, the present invention is a chassis assembly structure including: a front chassis side assembly that has a mechanical body, a front chassis that is provided on a front side of the mechanical body, and a plate-like mechanical holder that is provided on a rear side of the mechanical body and that has an upper surface projected to the rear side; and a bottom chassis that has an opened front side and an opened top part and that has at least a bottom surface and a rear surface, with the front chassis side assembly being assembled to the bottom chassis, wherein the bottom chassis has: a rear-side bent part that is formed on an upper part of the rear surface and bent to the front side; an upright part that rises from a lower edge of the opened front side; and an angled pressing tab that rises from the lower edge of the opened front side and that is formed further on the front side than the upright part, and that has an upper part inclined so as to be projected to the front side, and the front chassis side assembly is configured such that when an upper-surface end of the mechanical holder that is projected to the rear side is brought into contact with the rear-side bent part of the bottom chassis, and the front side thereof is rotated about the contact portion serving as a rotational support axis toward the bottom chassis, a lower part of the front chassis is invited and fitted between the angled pressing tab and the upright part along an inclined surface of the angled pressing tab.

Effect of the Invention

According to a chassis assembly structure of the present invention, the bent tab for preventing the erroneous assembly is eliminated, further, the load applied to the reinforcing plate of the FFC is reduced while the chassis size is reduced, and also the assembling and detaching between the chassis can be easily performed.

BEST MODE FOR CARRYING OUT THE INVENTION

In the following, an embodiment of the present invention will be described in detail with reference to the accompanying drawings.

Embodiment 1.

Figure 1:
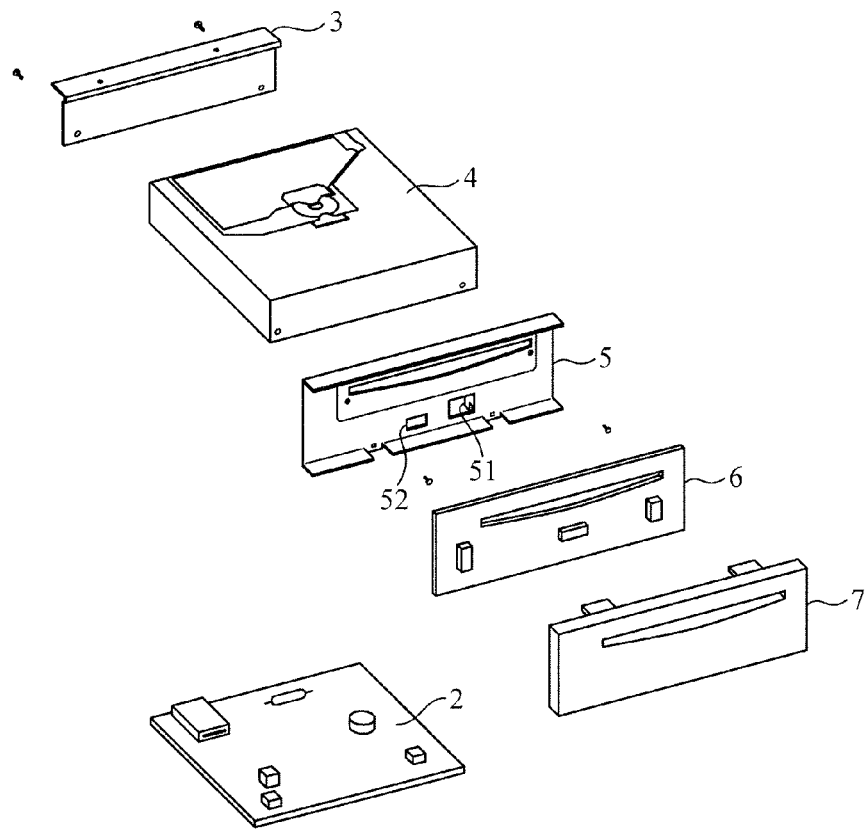
FIG. 1 is an exploded perspective view showing an example of a whole configuration of a conventional electronic apparatus.
Figure 1:
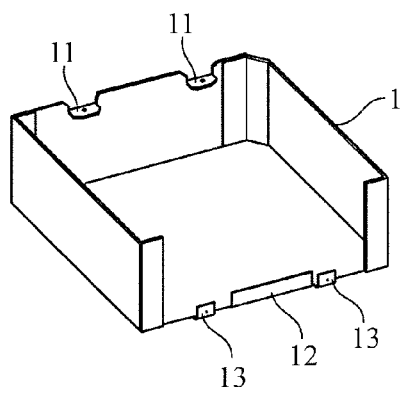

FIG. 1 is an exploded perspective view showing an example of a whole configuration of a conventional electronic apparatus. As shown in FIG. 1, in this electronic apparatus, a front chassis side assembly 20 (see FIG. 2(a)) including a mechanical holder 3, a mechanical body 4, and a front chassis 5 is assembled to a bottom chassis side assembly 10 (see FIG. 2(b)) in which a printed wiring board 2 is disposed in a bottom chassis 1, and a front panel board 6 and a front panel 7 are assembled to the front. In addition, a cover chassis (not shown) is finally mounted from above.

Figure 2:
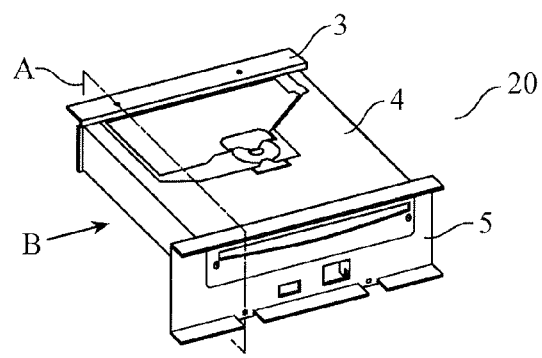
FIG. 2 is a set of exploded perspective views showing an example of a configuration of the electronic apparatus in a state where a bottom chassis side assembly and a front chassis side assembly are assembled in FIG. 1.
Figure 2:
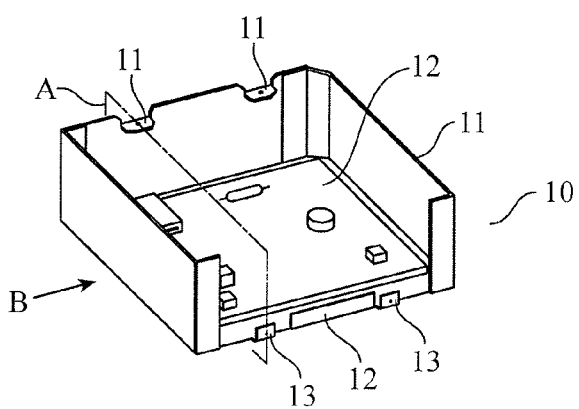

FIG. 2 is a set of exploded perspective views showing an example of a configuration of the electronic apparatus in a state where the bottom chassis side assembly 10 and the front chassis side assembly 20 are assembled in FIG. 1. As shown in FIG. 2(a), the front chassis side assembly 20 has the mechanical body 4, the front chassis 5 that is provided on the front side of the mechanical body 4, and the plate-like mechanical holder 3 that is provided on the rear side of the mechanical body 4, and has an upper surface projected to the rear side. In addition, as shown in FIG. 1, the bottom chassis 1 has a front side and a top part that are opened, has at least a bottom surface and a rear surface, and has rear-side bent parts 11 that are formed on an upper part of the rear surface and bent to the front side, a front upright part 12 that rises from the lower edge of the opened front side, and pressing tabs 13 that similarly rise from the lower edge of the opened front side, and that are formed further on the front side than the front upright part 12.

Figure 3:
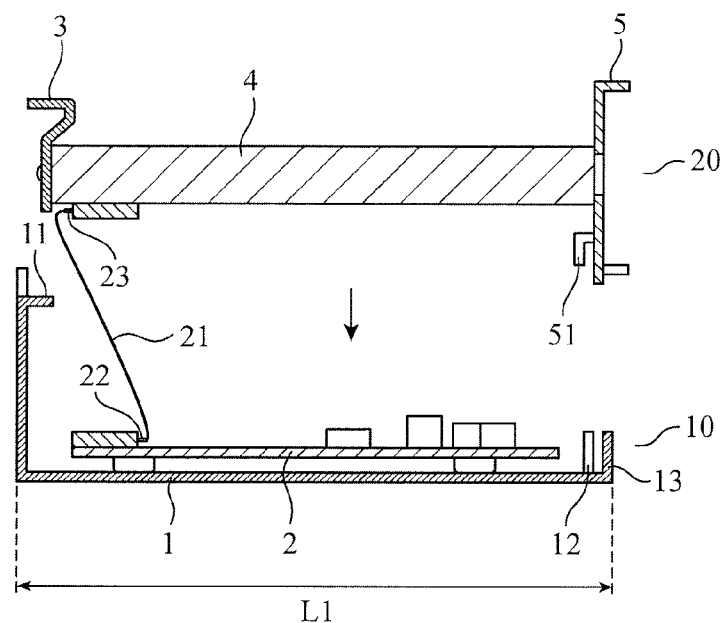
FIG. 3 is a set of side views in assembling the front chassis side assembly in the bottom chassis side assembly shown in FIG. 2.
Figure 3:
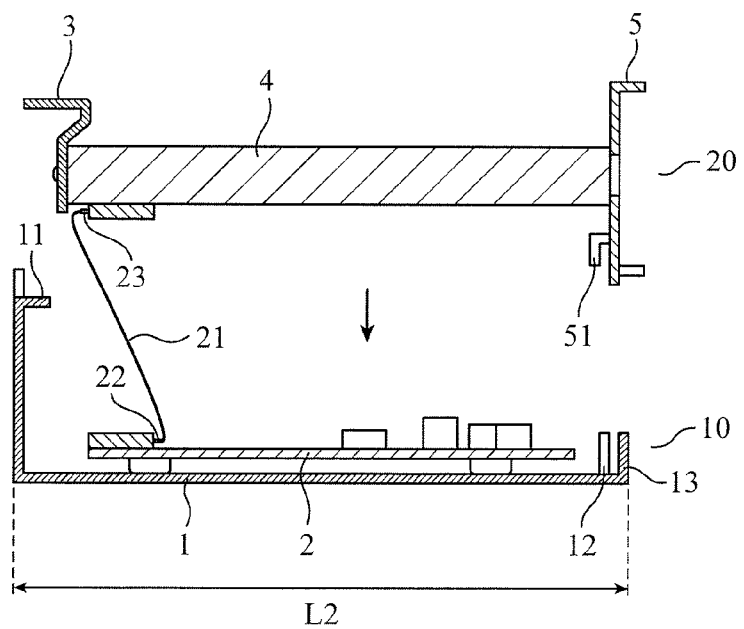

Further, FIG. 3 is a set of side views in assembling the front chassis side assembly 20 to the bottom chassis side assembly 10 shown in FIG. 2, as a cross-section A is viewed from a direction B. In this case, the mechanical holder 3 includes an upper surface formed by bending the upper part to the front side, and then projecting the bent part to the rear side. In the conventional, as shown in FIG. 3(a), the front chassis side assembly 20 is assembled to the bottom chassis side assembly 10 in a drop lid manner from right above, and therefore the mechanical holder 3 and mechanical body 4 hit the rear-side bent parts 11 formed on the upper part of the rear surface of the bottom chassis 1, so that the assembling work is not easy. For this reason, in order to prevent the mechanical holder 3 from hitting the rear-side bent parts 11 of the bottom chassis 1, the size of the bottom chassis 1 needs to be lightly increased as shown in FIG. 3(b).

FIG. 3(a) is a figure showing that the mechanical holder 3 hits the rear-side bent parts 11 of the bottom chassis 1, when the front chassis side assembly 20 is assembled to the bottom chassis in the drop lid manner from right above, in a case where a distance from the front side to the rear side of the bottom chassis 1 is L1, and FIG. 3(b) is a figure showing that the mechanical holder 3 does not hit the rear-side bent parts 11 of the bottom chassis 1, even when the front chassis side assembly 20 is assembled to the bottom chassis in the drop lid manner from right above, in a case where the distance from the front side to the rear side of the bottom chassis 1 is set to L2 that is larger than L1. That is, in the conventional, as shown in FIG. 3(b), unless the distance from the front side to the rear side of the bottom chassis 1 is set to L2 (L2>L1), the front chassis side assembly 20 cannot be assembled to the bottom chassis 1.

Additionally, in the case of assembling in the drop lid manner as mentioned above, an FFC 21 needs to have a certain length, and a load is applied to terminal parts (connection parts with the FFC 21) of the reinforcing plate 22 or the reinforcing plate 23 of the FFC 21, which may cause connection failure.

Figure 4:
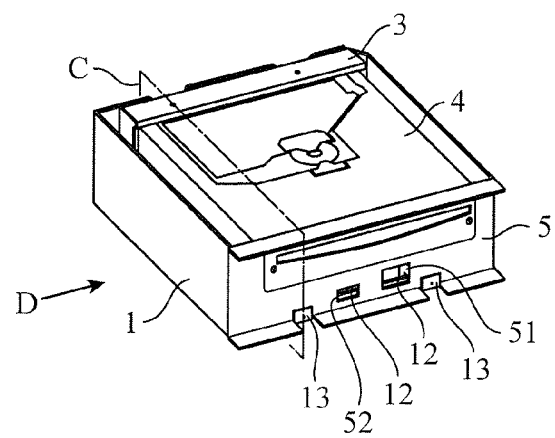
FIG. 4 is a perspective view showing a state where the front chassis side assembly is assembled to the bottom chassis side assembly.
Figure 5:
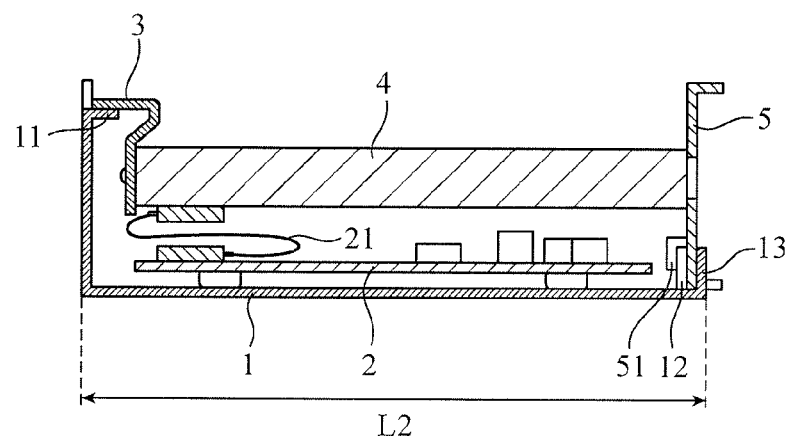
FIG. 5 is a side view showing a state where the front chassis side assembly is assembled to the bottom chassis side assembly shown in FIG. 4.

FIG. 4 is a perspective view showing a state where the front chassis side assembly 20 is assembled to the bottom chassis side assembly 10 shown in FIG. 2 and FIG. 3, and FIG. 5 is a side view showing a state where the front chassis side assembly 20 is assembled to the bottom chassis side assembly 10 shown in FIG. 4, as a cross-section C is viewed from a direction D. In the case of assembling in this manner, a bent tab 51 for alignment is formed in the front chassis 5 (see FIG. 6(a)), a hook (key) part of the bent tab 51 is fitted to the front upright part 12 that rises from the lower edge of the opened front side of the bottom chassis 1 (see FIG. 6(b)), and further the lower part of the front chassis 5 is sandwiched between the front upright part 12 of the bottom chassis 1, and the pressing tabs 13 that are formed further on the front side than the front upright part 12 and rise from the lower edge of the opened front side of the bottom chassis 1 to be fixed.

In this connection, the bent tab 51 for alignment will be described. As described above, the front chassis side assembly 20 is assembled to the bottom chassis side assembly 10 in the drop lid manner from right above, and therefore in a case where this bent tab 51 is not formed, there is a possibility of an erroneous insertion such that the front chassis 5 is not inserted into a designated position of the bottom chassis 1 (between the front upright part 12 and the pressing tabs 13), and that the front chassis 5 is dropped on the outer side than the pressing tabs 13 (further on the right side than the pressing tabs 13 in FIG. 3). Therefore, the bent tab 51 is formed such that the hook part of the bent tab 51 is fitted to the front upright part 12 of the bottom chassis 1; thus, the bent tab 51 hits the front upright part 12, and the front chassis 5 is not assembled in an erroneous state to the end, even when the front chassis 5 is dropped on the outer side than the pressing tabs 13; consequently, it is possible to prevent the erroneous insertion.

Additionally, although reference numerals are not given in the figures, a small projection is prepared on the inner side of the pressing tab 13 of the bottom chassis 1 (not on the front side), and a small hole is prepared at a position corresponding to the small projection in the front chassis 5. When the lower part of the front chassis 5 is sandwiched between the front upright part 12 and the pressing tabs 13, the pressing tabs 13 press the front chassis 5 to be fixed such that the small projections on the inner side of the pressing tabs 13 are fitted into the small holes of the front chassis 5.

Figure 7:
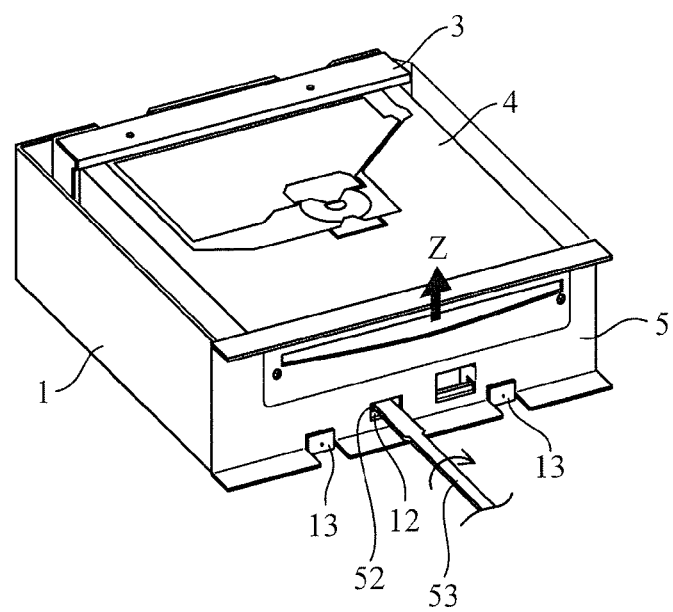
FIG. 7 is a perspective view showing a state where a tool is inserted into a hole provided in the front chassis when the front chassis side assembly is detached from the bottom chassis side assembly.

On the other hand, when both the assembled assemblies are detached from each other, it is configured such that when a tool 53 is rotated with inserted into a hole 52 for detaching the chassis that is formed in the front chassis 5, the front chassis side assembly 20 can be detached from the bottom chassis side assembly 10 (see FIG. 7). Specifically, as shown in FIG. 7, there is provided the following structure: when the tool 53 such as a flathead screwdriver is rotated with inserted into the hole 52 for detaching the chassis, one side (end or edge) of the tool 53 is brought into contact with the upper part of the front upright part 12 of the bottom chassis 1, and further the other side (end, edge) of the tool 53 is brought into contact with the upper part of the hole 52 for detaching the chassis formed in the front chassis 5, so that the front chassis 5 assembled to the bottom chassis 1 is pressed upward (in a direction Z shown in FIG. 7) to be detached.

Figure 6:
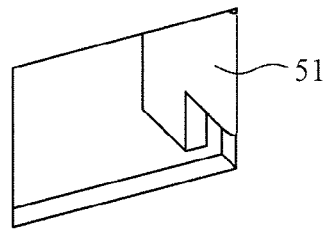
FIG. 6 is a set of enlarged views of a bent tab formed in a front chassis.
Figure 6:
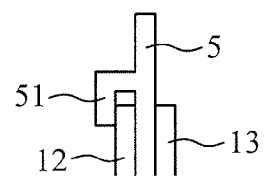

FIG. 6(*a*) is an enlarged perspective view of only the bent tab 51 part in the front chassis 5, and FIG. 6(*b*) is an enlarged view of the bent tab 51 part in the side view shown in FIG. 5. In addition, FIG. 7 is a perspective view showing a state where the tool 53 is inserted into the hole 52 for detaching the chassis formed in the front chassis 5, in a case where the front chassis side assembly 20 is detached from the assembled bottom chassis side assembly 10.

As mentioned above, in the conventional assembly structure, the alignment in assembling is difficult. When the bent tab 51 is formed in order to prevent erroneous assembly between the chassis, the hole will be formed, and therefore the matter of EMC (Electro-Magnetic Compatibility) or dust may become serious; additionally, the hole 52 for detaching the chassis for detaching between the chassis is required, and the tool 53 is further required in the case of detaching between the chassis, which is inconvenient.

On the other hand, in a chassis assembly structure according to Embodiment 1 of the present invention, the following is configured: the assembling manner is established in a rotational manner instead of the drop lid manner, and also the pressing tab formed in the bottom chassis is angled, so that the bent tab for preventing the erroneous assembly will be eliminated, and further the load applied to the reinforcing plate of the FFC is reduced while the size of the chassis is reduced, and the assembling and detaching between the chassis can be easily performed.

Figure 8:
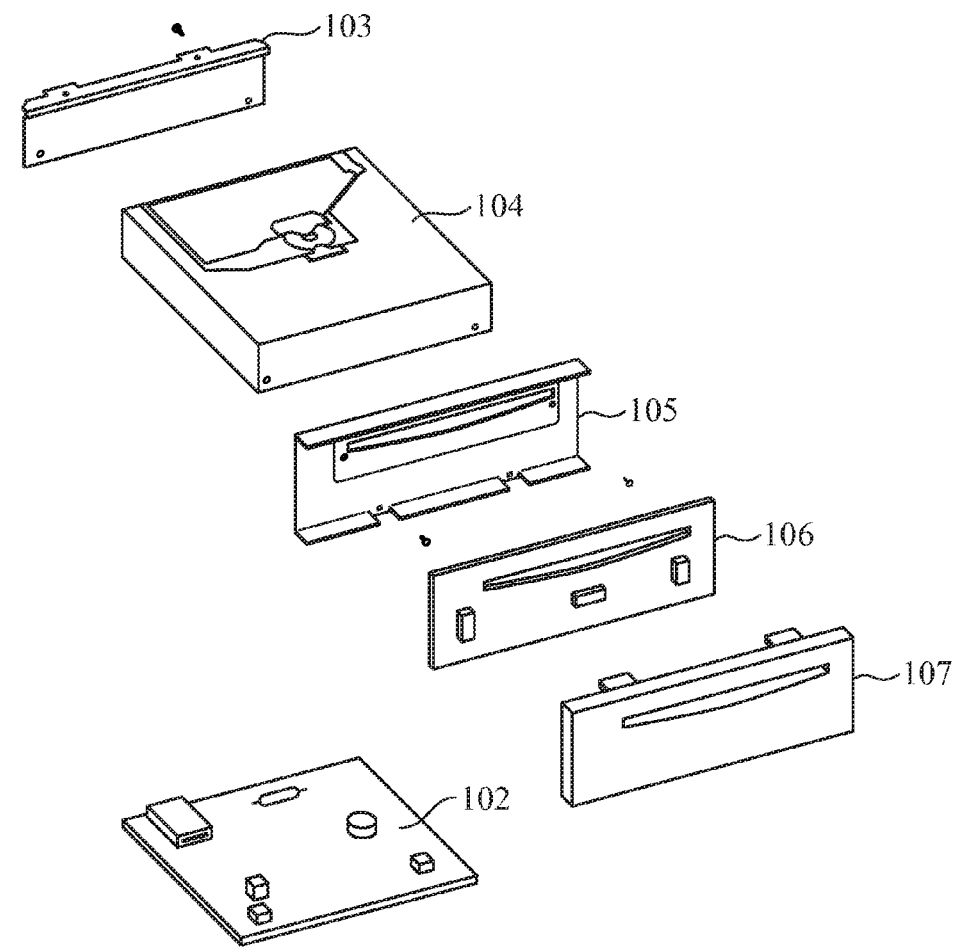
FIG. 8 is an exploded perspective view showing an example of a whole configuration of an electronic apparatus according to Embodiment 1.
Figure 8:
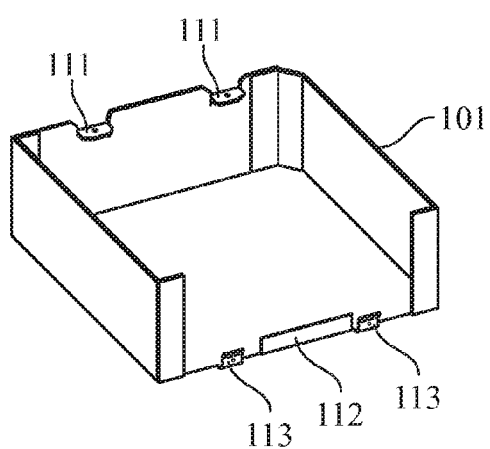

FIG. 8 is an exploded perspective view showing an example of a whole configuration of an electronic apparatus according to Embodiment 1 of the present invention. As shown in FIG. 8, in this electronic apparatus, a front chassis side assembly 120 (see FIG. 9(*a*)) including a mechanical holder 103, a mechanical body 104, and a front chassis 105 is assembled to a bottom chassis side assembly 110 (see FIG. 9(*b*)) in which a printed wiring board 102 is disposed in a bottom chassis 101, and a front panel board 106 and a front panel 107 are assembled to the front. In addition, a cover chassis (not shown) is finally mounted from above.

Figure 9:
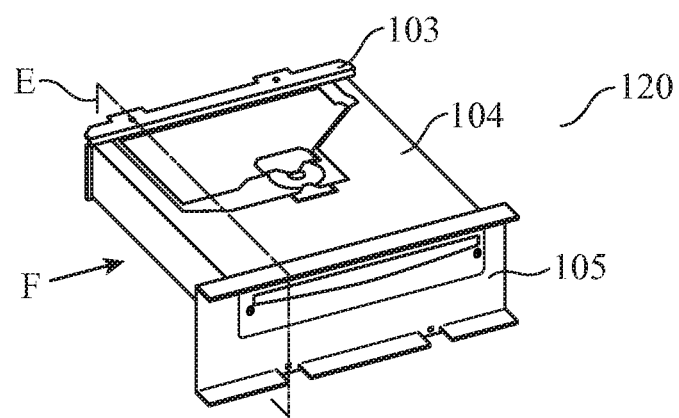
FIG. 9 is a set of perspective views showing an example of a configuration of the electronic apparatus in a state where a bottom chassis side assembly and a front chassis side assembly are assembled in FIG. 8.
Figure 9:
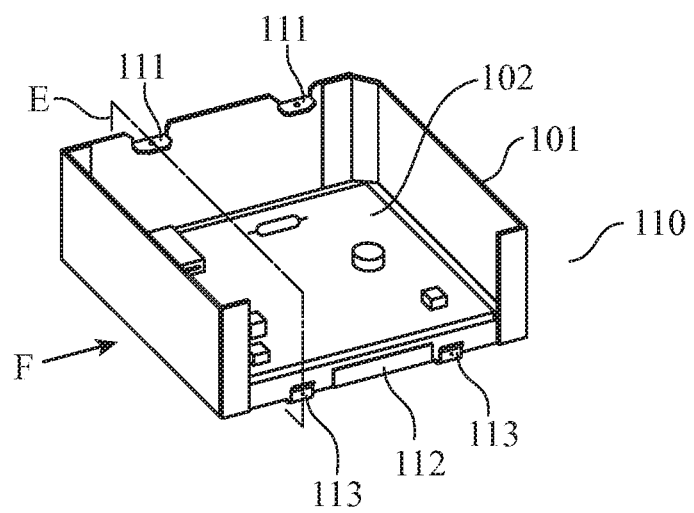

FIG. 9 is a set of perspective views showing an example of a configuration of the electronic apparatus in a state where the bottom chassis side assembly 110 and the front chassis side assembly 120 are assembled in FIG. 8. As shown in FIG. 9(*a*), the front chassis side assembly 120 has the mechanical body 104, the front chassis 105 that is provided on the front side of the mechanical body 104, and the plate-like mechanical holder 103 that is provided on the rear side of the mechanical body 104, and has an upper surface projected to the rear side. In addition, as shown in FIG. 8, the bottom chassis 101 has a front side and a top part that are opened, has at least a bottom surface and a rear surface, and has rear-side bent parts 111 that are formed at an upper part of the rear surface and bent to the front side, a front upright part 112 that rises from the lower edge of the opened front side, and angled pressing tabs 113 formed further on the front side than the front upright part 112, rising from the lower edge of the opened front side, and having an upper part inclined so as to be projected to the front side.

Figure 10:
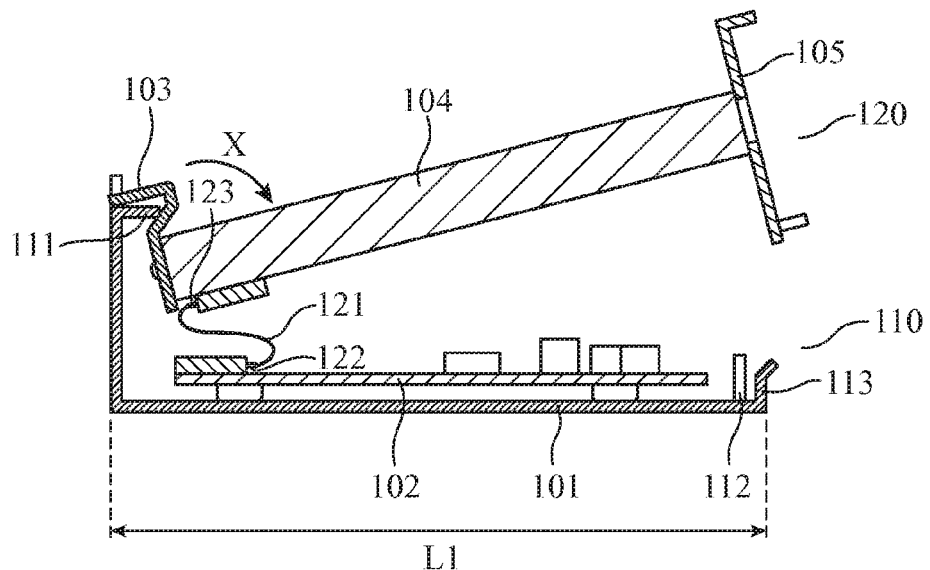
FIG. 10 is a set of side views in assembling the front chassis assembly in the bottom chassis assembly shown in FIG. 9.

In addition, FIG. 10 is a set of side views in assembling the front chassis side assembly 120 in the bottom chassis side assembly 110 shown in FIG. 9, as a cross-section E is viewed from a direction F. In this case, the mechanical holder 103 includes an upper surface formed by bending the upper part to the front side and then projecting the bent upper part to the rear side. In this Embodiment 1, when the front chassis side assembly 120 is assembled to the bottom chassis 101, as shown in FIG. 10, an upper-surface end projected to the rear side of the mechanical holder 103 of the front chassis side assembly 120 is brought into contact with the rear-side bent parts 111 formed in the upper part of the rear surface of the bottom chassis 101, and the front side is rotated about the contact portion serving as a rotational support axis toward the bottom chassis (in a direction X).

Consequently, the lower part of the front chassis 105 is invited between the angled pressing tabs 113 and the front upright part 112 along an inclined surface of the angled pressing tabs 113 to be fitted (see FIG. 12), and therefore the front chassis side assembly 120 can be easily assembled to the bottom chassis 101. Additionally, the rotational support axis of the two assemblies are arranged near an FFC 121, and the length of the FFC 121 can be thus shortened, and also by virtue of a manner to be assembled by the rotation, no load is applied to connection parts of the FFC 121 with reinforcing plates 122 and 123. Furthermore, since it is assembled by the rotation as mentioned above, the rear-side bent parts 111 of the bottom chassis 101 are fitted into a bent portion of the mechanical holder 103 upon completion of the assembling (see FIG. 12), and therefore a distance from the front side to the rear side of the bottom chassis 101 can be set to L1, which cannot be achieved in the conventional (see FIG. 3), and thus the chassis size can be reduced.

Figure 11:
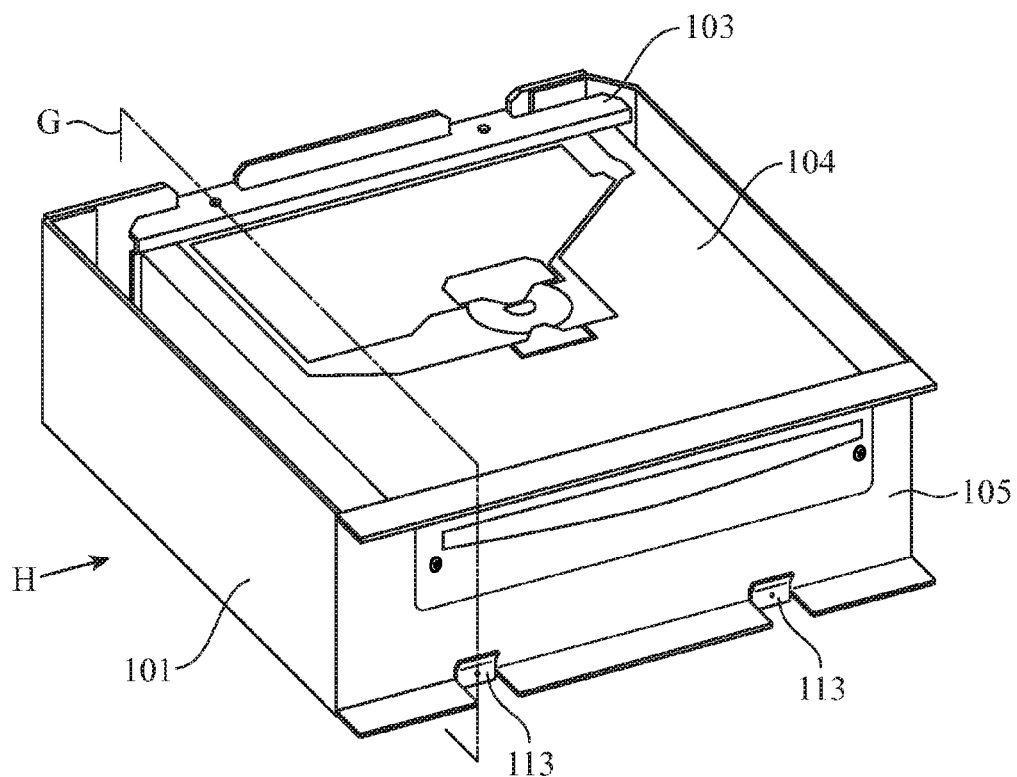
FIG. 11 is a perspective view showing a state where the front chassis side assembly is assembled to the bottom chassis side assembly.
Figure 12:
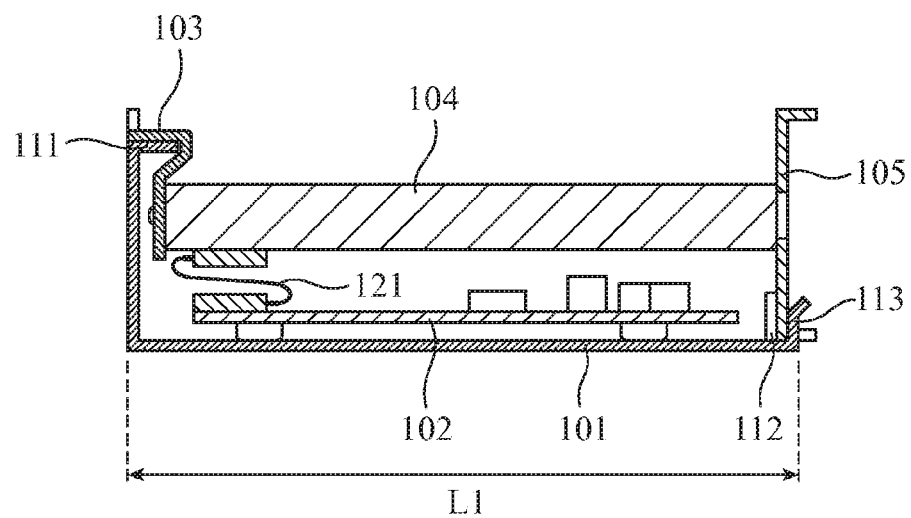
FIG. 12 is a side view showing a state where the front chassis side assembly is assembled to the bottom chassis side assembly shown in FIG. 10.

FIG. 11 is a perspective view showing a state where the front chassis side assembly 120 is assembled to the bottom chassis side assembly 110 shown in FIG. 9 and FIG. 10, and FIG. 12 is a side view showing a state where the front chassis side assembly 120 is assembled to the bottom chassis side assembly 110 shown in FIG. 11, as a cross-section G is viewed from a direction H. When it is assembled in this way, the lower part of the front chassis 105 is fitted between the front upright part 112 that rises from the lower edge on the opened front side of the bottom chassis 101, and the angled pressing tabs 113 that similarly rise from the lower edge of the opened front side of the bottom chassis 101, and that are formed further on the front side than the front upright part 112 (see FIG. 12).

Figure 13:
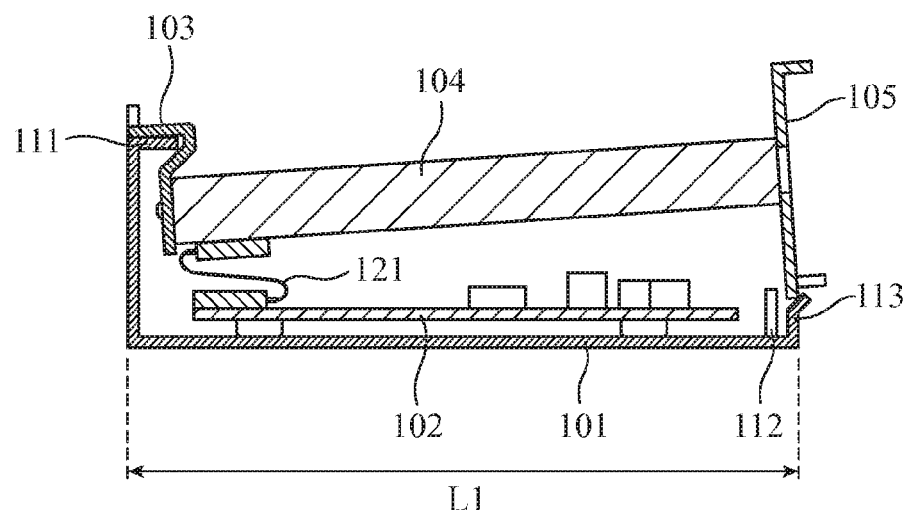
FIG. 13 is a figure showing a state where the front chassis side assembly is rotated from the state shown in FIG. 10, and a front chassis is brought into contact with an angled pressing tab formed in a bottom chassis.

FIG. 13 is a figure showing a state where the front chassis side assembly 120 is rotated toward the bottom chassis (in the direction X) from the state shown in FIG. 10, and a lower end portion of the front chassis 105 is brought into contact with the angled pressing tabs 113 formed in the bottom chassis 101, that is, a state immediately before the assembling is completed as shown in FIG. 12. Then, the lower part of the front chassis 105 is led along the inclined surface of the angled pressing tabs 113 of the bottom chassis 101, and the lower part of the front chassis 105 is fitted between the front upright part 112 of the bottom chassis 101 and the angled pressing tabs 113.

Additionally, although reference numerals are not given in the figures, a small projection is prepared on the inner side of the angled pressing tabs 113 of the bottom chassis 101 (not on the front side), and a small hole is prepared at a position corresponding to the small projection in the front chassis 105. When the lower part of the front chassis 105 is sandwiched between the front upright part 112 and the angled pressing tabs 113, the angled pressing tabs 113 press the front chassis 105 to be fixed such that the small projection on the inner side of the angled pressing tabs 113 is fitted into the small hole of the front chassis 105.

As described above, the front chassis 105 of the front chassis side assembly 120 is invited by the angled pressing tabs 113 to be assembled at a designated place, and therefore unlike the conventional, even when the bent tab 51 for alignment is not formed, a possibility of the erroneous insertion is eliminated, and the assembling work is facilitated. Additionally, because the bent tab 51 is no longer required, the hole does not have to be opened due to the absence of the bent tab 51. Consequently, an effect of reducing the matter of EMC or dust is also obtained.

Further, as a result assembled in this way, as shown in FIG. 12, the rear-side bent parts 111 of the bottom chassis 101 are located on the upper side of the mechanical body 104, that is, the rear-side bent parts 111 are in a state fitted into the bent portion of the mechanical holder 103, and therefore an effect of enabling reduction in the size of the bottom chassis 101 compared to the conventional is also obtained.

Figure 14:
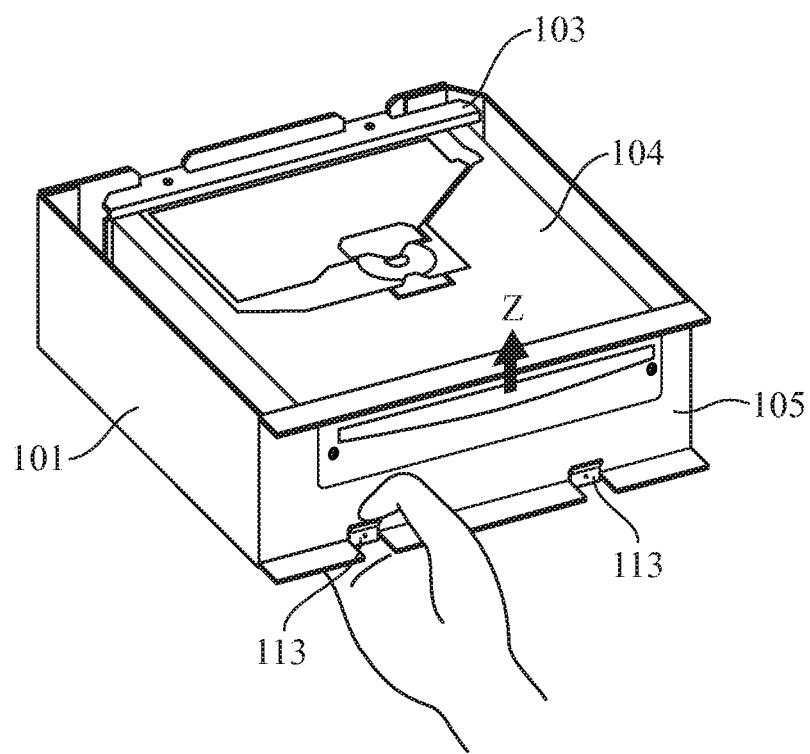
FIG. 14 is a perspective view showing a state where the front chassis side assembly is detached from the bottom chassis side assembly.

On the other hand, FIG. 14 is a perspective view showing a state where the front chassis side assembly 120 is detached from the assembled bottom chassis side assembly 110. As shown in FIG. 14, with inclined portions of the angled pressing tabs 113 rising from the lower edge on the opened front side of the bottom chassis 101, and formed at the forefront on the front side being pressed downward by fingers etc., the front chassis 105 is simply pulled up in an upper direction (in a direction Z shown in FIG. 14), so that the front chassis side assembly 120 can be easily detached from the bottom chassis side assembly 110 without using any tool.

As described above, according to Embodiment 1, the chassis (assembly article of the front chassis and the mechanism) of the electronic apparatus is assembled to the bottom chassis by the rotation, so that the assembling can be easily performed, and also the angled pressing tabs formed in the bottom chassis invites the front chassis smoothly, so that the possibility of the erroneous insertion is eliminated even when the bent tab is not formed, and the matter of EMC or dust is also reduced. Furthermore, the rotational support axis is disposed near the FFC, and therefore the length of the FFC can be shortened, and no load is applied to the connection parts of the reinforcing plates of the FFC.

Moreover, not only the alignment in assembling the chassis or the chassis assembling work is facilitated, but also in detaching the chassis, the front chassis side assembly can be easily detached from the bottom chassis without using any tool by simply pressing the angled pressing tabs formed in the bottom chassis downward by fingers etc. and pulling up the front chassis in the upper direction.

Incidentally, the present invention can be implemented by modification of arbitrary components of the embodiment, or omission of arbitrary components of the embodiment, within the scope of the invention.

INDUSTRIAL APPLICABILITY

The present invention is applicable to an electronic apparatus in which a chassis is assembled, such as a car audio and a navigation apparatus.

EXPLANATION OF REFERENCE NUMERALS 1, 101 bottom chassis
2, 102 printed wiring board
3, 103 mechanical holder
4, 104 mechanical body
5, 105 front chassis
6, 106 front panel board
7, 107 front panel
10, 110 bottom chassis side assembly
11, 111 rear-side bent part of bottom chassis
12, 112 front upright part of bottom chassis
13 pressing tab of bottom chassis
20, 120 front chassis side assembly
21, 121 FFC
22, 23, 122, 123 reinforcing plate of FFC
51 bent tab
52 hole for detaching chassis
53 tool
113 angled pressing tab of bottom chassis.

The invention claimed is:

1. A chassis assembly structure comprising:
a front chassis side assembly including a mechanical body, a front chassis that is provided on a front side of the mechanical body, and a plate-like mechanical holder that is provided on a rear side of the mechanical body and that has an upper surface projected to the rear side; and
a bottom chassis including an opened front side and an opened top part and that has at least a bottom surface and a rear surface,
with the front chassis side assembly being assembled to the bottom chassis, wherein the bottom chassis further including,
a rear-side bent part that is formed on an upper part of the rear surface and bent to the front side;
an upright part that rises from a lower edge of the opened front side; and
an angled pressing tab that rises from the lower edge of the opened front side and that is formed further on the front side than the upright part, and that has an upper part inclined so as to be projected to the front side; and
wherein the front chassis side assembly is configured such that when an upper-surface end of the mechanical holder that is projected to the rear side is brought into contact with the rear-side bent part of the bottom chassis as a contact portion, and the front side thereof is rotated about the contact portion serving as a rotational support axis toward the bottom chassis, a lower part of the front chassis is invited and fitted between the angled pressing tab and the upright part along an inclined surface of the angled pressing tab; and
wherein the mechanical body and a printed wiring board disposed in the bottom chassis are connected by a flexible cable arranged near the rotational support axis.

2. The chassis assembly structure according to claim 1, wherein the mechanical holder provided on the rear side of the mechanical body includes the upper surface formed by bending an upper part of the mechanical holder to the front side and then projecting the bent upper part to the rear side, and
when the front chassis side assembly is rotated toward the bottom chassis, the rear-side bent part of the bottom chassis is fitted into a portion bent to the front side of the upper part of the mechanical holder.

* * * * *